(12) United States Patent
He et al.

(10) Patent No.: US 8,450,167 B2
(45) Date of Patent: May 28, 2013

(54) METHOD OF FABRICATING SEMICONDUCTOR DEVICES

(75) Inventors: Qiyang He, Beijing (CN); Yiying Zhang, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/293,052

(22) Filed: Nov. 9, 2011

(65) Prior Publication Data
US 2012/0309152 A1 Dec. 6, 2012

(30) Foreign Application Priority Data

Jun. 2, 2011 (CN) .......................... 2011 1 0147455

(51) Int. Cl.
| H01L 21/306 | (2006.01) |
| H01L 21/308 | (2006.01) |
| H01L 29/165 | (2006.01) |
| H01L 29/66 | (2006.01) |
| H01L 29/78 | (2006.01) |

(52) U.S. Cl.
USPC ........... 438/198; 438/285; 438/300; 438/303; 438/492; 438/701; 438/705; 438/733; 438/734

(58) Field of Classification Search
USPC ................. 438/706, 710, 712, 714, 719, 720, 438/723, 724, 739, 298, 589, 707, 733–735, 438/745, 303, 285
See application file for complete search history.

(56) References Cited

U.S. PATENT DOCUMENTS

| 7,303,999 | B1 * | 12/2007 | Sriraman et al. | 438/719 |
| 2005/0148147 | A1 * | 7/2005 | Keating et al. | 438/299 |
| 2009/0189203 | A1 * | 7/2009 | Matsuo | 257/288 |
| 2010/0075476 | A1 * | 3/2010 | Miyashita | 438/229 |
| 2011/0049643 | A1 * | 3/2011 | Matsuoka | 257/408 |
| 2011/0079856 | A1 * | 4/2011 | Tsai et al. | 257/369 |
| 2011/0104875 | A1 * | 5/2011 | Wojtczak et al. | 438/478 |
| 2011/0312145 | A1 * | 12/2011 | Tsai et al. | 438/300 |
| 2012/0058616 | A1 * | 3/2012 | Ahn et al. | 438/285 |
| 2012/0088342 | A1 * | 4/2012 | Ming et al. | 438/230 |
| 2012/0097977 | A1 * | 4/2012 | Yamaguchi | 257/77 |
| 2012/0267683 | A1 * | 10/2012 | Kronholz et al. | 257/192 |
| 2013/0017661 | A1 * | 1/2013 | Wei et al. | 438/303 |

* cited by examiner

*Primary Examiner* — Olik Chaudhuri
*Assistant Examiner* — Wilner Jean Baptiste
(74) *Attorney, Agent, or Firm* — Innovation Counsel LLP

(57) ABSTRACT

A method of fabricating semiconductor device includes forming a plurality of gates on a substrate, forming a top layer on a top surface of each gate, forming sidewall spacers on opposite sides of each gate, and forming sacrificial spacers on the sidewall spacers. The method further includes performing a dry etching process on the substrate using the top layer and the sacrificial spacers as a mask to form a recess of a first width in the substrate between two adjacent gates, performing an isotropic wet etching process on the recess to expand the first width to a second width, and performing an orientation selective wet etching process on the recess to shape the rectangular-shaped recess into a Σ-shaped recess.

18 Claims, 5 Drawing Sheets poor seed growth

METHOD OF FABRICATING SEMICONDUCTOR DEVICES

CROSS-REFERENCES TO RELATED APPLICATIONS

This application claims priority to Chinese Patent Application No. 201110147455.2, filed on Jun. 2, 2011 and entitled "Method of Fabricating Semiconductor Devices", which is incorporated herein by reference in its entirety. This application is related to commonly assigned U.S. patent application Ser. No. 13/293,001, filed Nov. 9, 2011, and commonly assigned U.S. patent application Ser. No. 13/293,030, filed Nov. 9, 2011, the contents of all of which are incorporated herein by reference in their entirety.

BACKGROUND

1. Field of the Invention

The present disclosure relates to methods of fabricating semiconductor devices, and more particularly, to methods of fabricating semiconductor devices including PMOS devices having embedded SiGe (eSiGe) in a substrate.

2. Description of the Related Art

In order to meet the demand of users for low profile electronics, in enhanced Very Large Scale Integration (VLSI) processes, stress engineering has been used to improve performance of devices. One of the effective ways is to utilize embedded SiGe (eSiGe) structures to increase hole mobility in the channel regions of a PMOS device.

In a Sigma-shaped ($\Sigma$-shaped) eSiGe structure, stress in the channel regions can be effectively increased since the lattice constant of SiGe is larger than that of Si and the distance between source and drain regions is reduced by using the $\Sigma$-shaped SiGe structure.

A prior art method of forming a $\Sigma$-shaped SiGe structure in a PMOS device is shown in FIGS. 1A to 1D. After forming on a Si substrate a dielectric layer, gates are formed on the dielectric layer and sidewall spacers are formed on opposite sides of each gate (FIG. 1A). Thereafter, a recess is formed between adjacent gates in the Si substrate by dry etching, as shown in FIG. 1B. The cross section of the recess shown in FIG. 1B has a substantially rectangular shape with a planar bottom and vertical walls, which is defined by four vertices A, B, C and D.

Next, as shown in FIG. 1C, the rectangular-shaped recess is wet etched in an orientation selective manner to be expanded into a $\Sigma$-shaped recess. Commonly, orientation selective wet etching has a faster etch rate on (100) orientation of planes than on (111) orientation of planes. In fact, orientation selective wet etching substantially stops on (111) orientation of planes. As a result, two vertices C, D formed after the dry etching shown in FIG. 1B are remained as etching stop points of (111) orientation of planes. Finally, as shown in FIG. 1D, SiGe is epitaxially grown in the resulting $\Sigma$-shaped recess to form SiGe source and drain regions.

After having thoroughly studied the prior art methods of forming $\Sigma$-shaped SiGe, the inventors of the present invention discovered that it was difficult to obtain an epitaxial growth of SiGe using the prior art methods.

Specifically, in the dry etching process performed on the substrate shown in FIG. 1B, defects such as Si lattice mismatch or the like can occur at edges of the formed rectangular-shaped recess, particularly at the vertices C, D shown in FIG. 1B, due to plasma bombardment. As mentioned above, as a result of orientation selective wet etching, the vertices C, D will keep out of etching as (111) orientation etching stop points. In the subsequent epitaxial growth of SiGe, the seed layer is very sensitive to Si surface conditions, such as cleanness and Si lattice condition. Defects such as Si lattice mismatch can lead to the difficulty in the epitaxial growth of a seed layer. Hence, as shown in FIG. 1E, Si lattice defects at points of C and D will make the implementation of subsequent epitaxial growth of a SiGe seed layer more difficult.

BRIEF SUMMARY

The present disclosure relates to methods of fabricating semiconductor devices, and more particularly, to methods of fabricating semiconductor devices including PMOS devices having embedded SiGe (eSiGe) in a substrate.

Embodiments of the disclosure provide a method of fabricating a semiconductor device. The method comprises steps of forming a plurality of gate structures on a substrate. The method further includes forming a top layer on a top surface of each gate structure, forming sidewall spacers on opposite sides of each gate structure, forming sacrificial spacers on the sidewall spacers, and performing a dry etching process on the substrate using the top layer and the sacrificial spacers as a mask to form a recess having a first width in the substrate between two adjacent gate structures. The method also includes performing an isotropic wet etching process on the recess to expand the first width into a second width, and performing an orientation selective wet etching process on the recess to shape inner walls of the recess into a $\Sigma$-shaped recess.

In one embodiment, the step of forming sacrificial spacers on the sidewall spacers comprises depositing a sacrificial spacing material on the sidewall spacers and on a surface of the substrate, and removing the sacrificial spacing material deposited on the surface of the substrate by a dry etching process.

In one embodiment, the deposition of the sacrificial spacing material comprises an atom layer deposition (ALD) process.

In one embodiment, the method further comprises removing the sacrificial spacers prior to performing an isotropic wet etching process on the recess to enlarge the width of the recess. In another embodiment, the sacrificial spacers are removed after performing an orientation selective wet etching process on the recess to shape the recess into a $\Sigma$-shaped recess.

In one embodiment, the first width of the recess is substantially equal a distance between the sacrificial spacers on the sidewall spacers of the two adjacent gate structures. In another embodiment, the second width of the recess is substantially equal to a distance between the sidewall spacers on the two adjacent gate structures.

In one embodiment, the sacrificial spacers have a material that is different from a material of the sidewall spacers.

In one embodiment, the sacrificial spacers are made of silicon nitride or silicon oxide.

In one embodiment, the step of removing the sacrificial spacers includes an isotropic wet etching or plasma striping process.

In one embodiment, the step of performing isotropic wet etching process on the recess includes performing a wet etching process on the recess with HF, $HNO_3$ or ammonia.

In one embodiment, the step of performing orientation selective wet etching process on the recess includes performing wet etching process on the recess with tetramethylammonium hydroxide (TMAH).

In one embodiment, the etching rate of the orientation selective wet etching on (100) orientation of planes is higher than an etching rate on (111) orientation of planes.

In one embodiment, the orientation selective wet etching substantially stops on (111) orientation of planes.

In one embodiment, the gate is a polysilicon gate. The substrate is a silicon substrate, and the dielectric layer is a silicon dioxide layer.

In one embodiment, the method further comprises performing epitaxial growth of SiGe in the Σ-shaped recess.

In one embodiment, the method further comprises performing ion implantation on the substrate to form source and drain regions before forming the sacrificial spacers.

In one embodiment, the method further comprises performing ion implantation on the substrate to form source and drain regions after performing the epitaxial growth of SiGe in the Σ-shaped recess.

In one embodiment, the depth of the recess is about 300Å to 500 Å before the orientation selective wet etching process is performed on the recess.

In one embodiment, the method further comprises before performing the dry etching process on the substrate to form the recess of the first width, forming a mask on top of areas to be formed as NMOS devices and exposing areas to be formed as PMOS devices.

Through forming sacrificial spacers and then removing by wet etching the substrate portions having lattice defects due to the damage of dry etching, an enhanced performance of epitaxial growth can be achieved.

BRIEF DESCRIPTION OF THE DRAWINGS

The accompanying drawings, which are incorporated in and constitute a part of the specification, illustrate embodiments of the invention and, together with the description, serve to explain the principles of the invention. The like reference labels in various drawings will refer to the like elements or steps.

The present invention can be more clearly understood from the following detailed description with reference to the drawings, wherein.

DETAILED DESCRIPTION

Figure 1A:
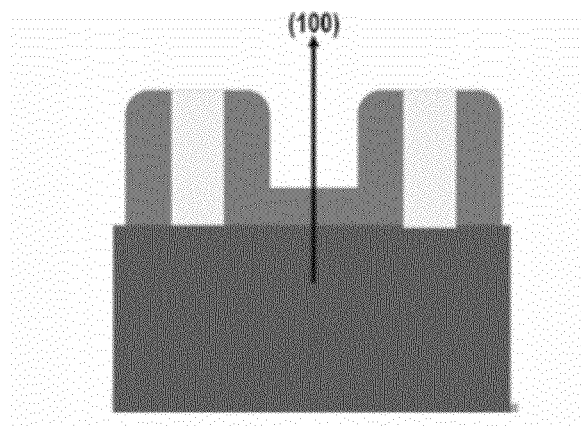
FIGS. 1A to 1D schematically show cross-sectional views of a semiconductor device during various stages of forming Σ-shaped SiGe in a PMOS device.
Figure 1B:
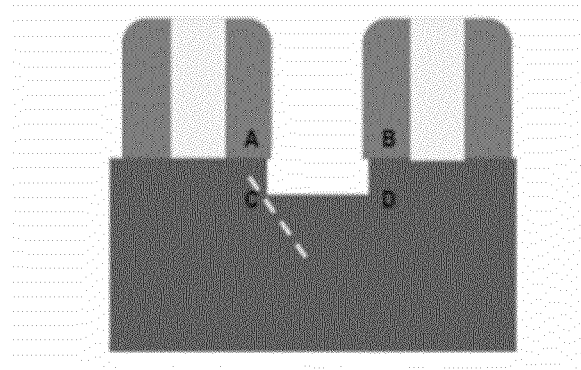
Figure 1C:
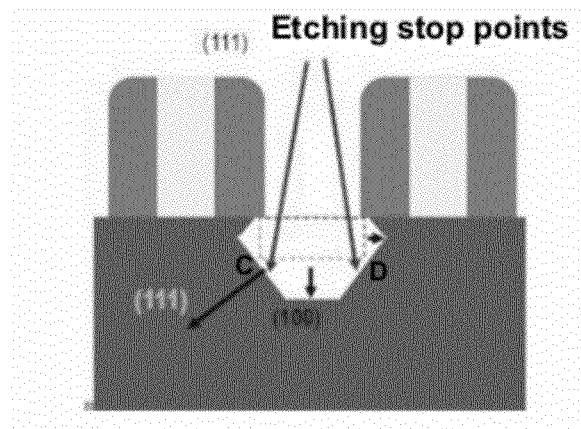
Figure 1D:
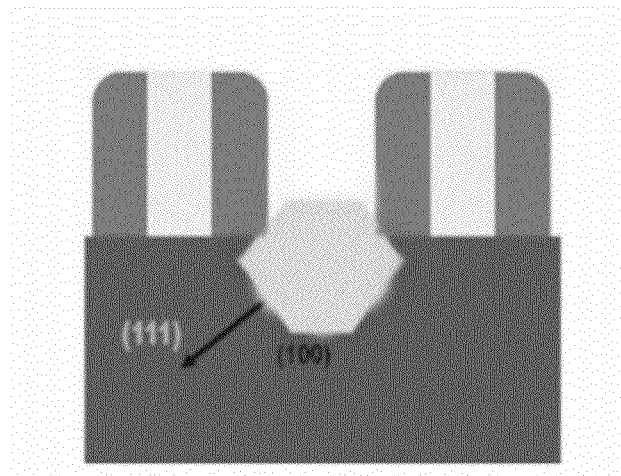
Figure 1E:
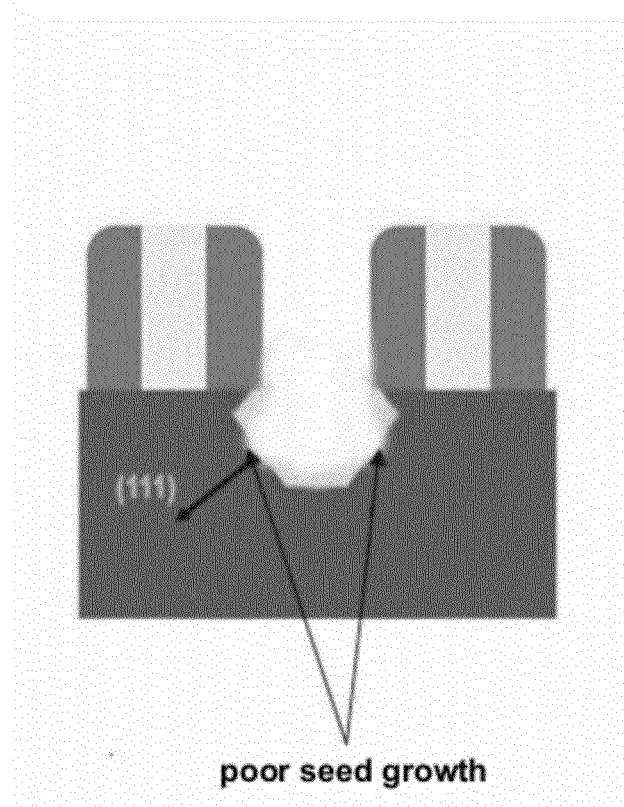
FIG. 1E shows defects resulting in poor growth of a seed layer provided by the prior stages illustrated in FIG. 1A to FIG. 1D.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that, for the convenience of description, various elements shown in the figures are not illustrated in actual proportion.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the mandated specification where appropriate.

In all of the examples illustrated and discussed herein, any specific values should be interpreted to be illustrative only and non-limiting. Thus, other examples of the exemplary embodiments could have different values depending upon specific applications.

It is noted that like reference numerals and letters refer to like items in the following figures, and thus once an element is described in one figure, it will not be further discussed in subsequent figures.

In an embodiment of the present invention, a sigma-shaped (Σ-shaped) recess can be formed in a substrate using the following method. The method begins with forming a plurality of gate structures on a substrate, forming sidewall spacers on opposite sides of each gate structure, and forming sacrificial spacers on the sidewall spacers. The method further includes dry etching the substrate using the sacrificial spacers and the gate structures as a mask to form a recess having a substantially rectangular shape. The rectangular-shaped recess has a first width that is defined as a distance between two adjacent sacrificial spacers. The method also includes removing portions of the substrate that are damaged during dry etching by an isotropic wet etching so that the first width of the recess is expanded to a second width. The method additionally includes removing the sacrificial spacers and shaping the inner walls of the recess into a Σ cross section by an orientation selective wet etching.

Through the formation of sacrificial spacers and then the removal by wet etching of the portions of the substrate that contain lattice defects resulting from dry etching, the method can provide good SiGe epitaxial growth performance.

Figure 2:
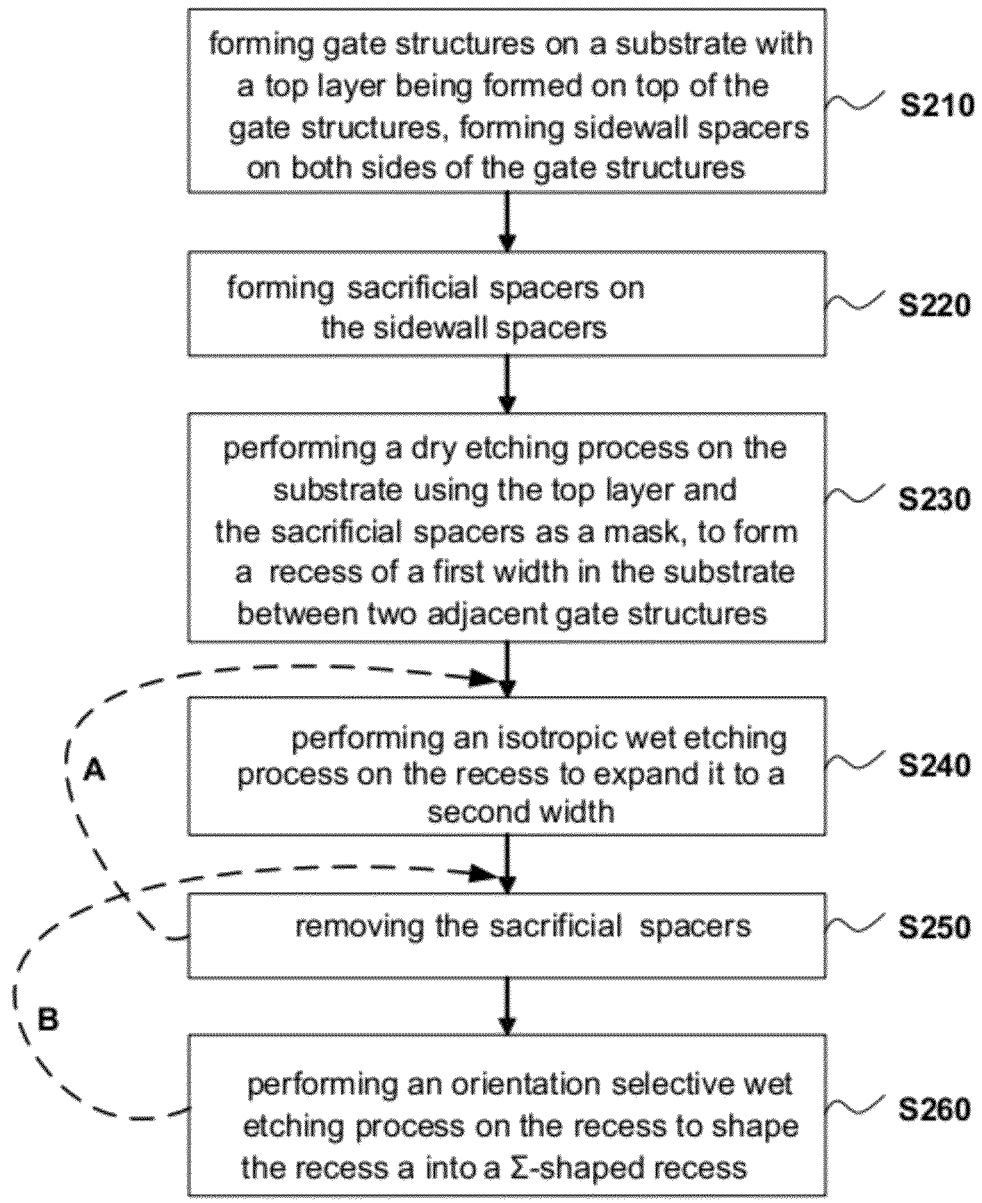
FIG. 2 schematically shows a flowchart of a method of forming a Σ-shaped recess in a PMOS device according to one embodiment of the disclosure.

FIG. 2 schematically shows a flowchart of a method 200 of forming a Σ-shaped SiGe structure in a PMOS device according to one embodiment of the present invention. FIGS. 3A to 3F are cross-sectional views schematically showing steps of the method 200 of forming the Σ-shaped SiGe structure shown in FIG. 2. The embodiment of this disclosure will be discussed in detail with reference to FIG. 2 and FIGS. 3A-3F.

Figure 3A:
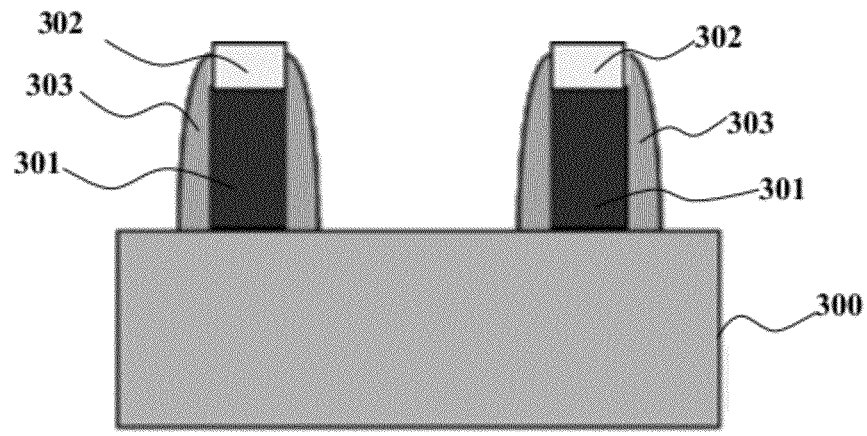
FIGS. 3A to 3F schematically show cross-sectional views of various steps of the method of forming the Σ-shaped recess in FIG. 2.

At step S210 in FIG. 2, a substrate 300 is provided, on which gate structures 301 are formed. Each of the gate structures 301 may include a dielectric layer overlying the substrate and a gate overlying the dielectric layer. A top layer 302 is formed on a top surface of each of the gate structures 301, and sidewall spacers 303 are formed on opposite sides of each gate structure, as shown in FIG. 3A. In an embodiment, the substrate can be made of silicon (Si). The gates can be, for example, polysilicon gates, and the dielectric layer can be a silicon dioxide layer. The top layer 302 and the sidewall spacers 303 are used to protect the gate structures 301 in subsequent dry etching, wet etching and source/drain ion-implantation processes. The top layer 302 can be, for example, silicon nitride. The sidewall spacers 303 can be, for example, silicon nitride or silicon oxide. The gate structures 301, top layer 302, and sidewall spacers 303 can be formed by using any processes well known to those skilled in the art, descriptions of which are omitted for the purpose of simplicity.

Figure 3B:
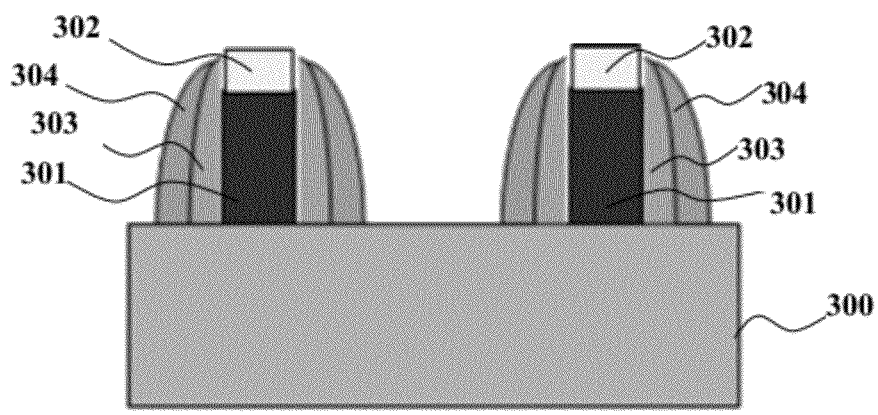

At step S220 in FIG. 2, sacrificial spacers 304 are formed on the sidewall spacers as shown in FIG. 3B. The sacrificial spacers 304 can be, in an embodiment, silicon oxide or silicon nitride, but contain a different material than that of the sidewall spacers 303, to facilitate the subsequent removal of the sacrificial spacers from the sidewall spacers. The sacrificial spacers 304 can have a thickness of about 20 Å to about 100 Å in an embodiment.

In one embodiment, the sacrificial spacers 304 can be formed by a deposition process. Specifically, the material of the sacrificial spacers can be deposited on the sidewall spacers 303 and on a surface of the substrate 300 disposed between two adjacent gate structures. Here, any deposition processes known in the art can be used for the deposition of the sacrificial spacers, such as, Chemical Vapor Deposition (CVD), Physical Vapor Deposition (PVD), Atom Layer Deposition (ALD), and thermal deposition.

Then, the sacrificial spacer material deposited on the surface of the substrate between two adjacent gate structures is removed by dry etching, and sacrificial spacers 304 formed on the sidewall spacers 303 are obtained. Here, dry etching may be a standard dry etching process of high etching selectivity ratio. In one example embodiment, the sacrificial spacers are $SiO_2$, a CF gas in a certain proportion (such as $CH_3F$, $C_4F_8$, $C_4F_6$, or the like) and $O_2$ can be used as main reactive gases in the dry etching.

Figure 3C:
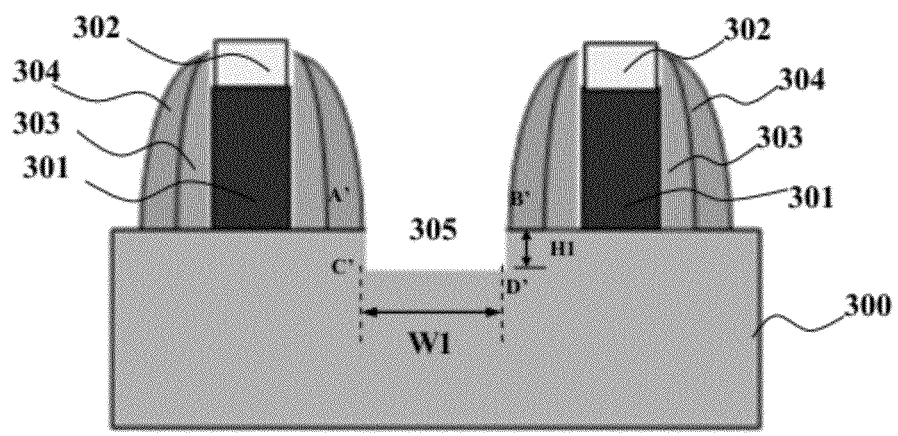

At step S230 in FIG. 2, the substrate 300 is dry etched using the top layer 302 and the sacrificial spacers 304 as a mask, to form a recess 305 in the substrate between two adjacent gate structures. As shown in FIG. 3C, the cross section of the recess 305 has a substantially rectangular shape that is defined by four vertices A', B', C' and D'. The rectangular-shaped recess has a width W1 and a depth H1. The width W1 of the recess 305 is substantially equal to the distance between the outer edges (at a close proximity to the surface of the substrate) of the adjacent sacrificial spacers. In an example embodiment, HBr or Cl2 can be used as main reactive gases in the dry etching process.

Figure 3D:
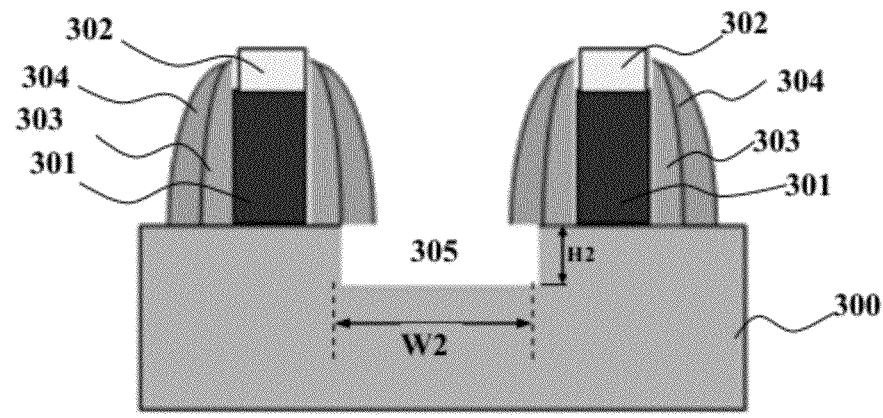

At step S240 in FIG. 2, an isotropic wet etching is performed to expand the recess 305 to a width W2 that is wider than the width W1, and a depth H2 that is deeper than the depth H1, as shown in FIG. 3D. Here, the width W2 of the recess 305 is substantially equal to the outer edges of the adjacent sidewall spacers. That is, the difference between the width W2 and the width W1 is approximately two times the bottom thickness of the sacrificial spacers. The depth H2 of the recess 305 can be, in an example embodiment, about 300 Å to about 500 Å. In an embodiment, a mixed solution of HF and $HNO_3$ or ammonia can be used in the isotropic wet etching process.

As mentioned above, the edges of the recess 305 and especially, the vertices C' and D', are often damaged due to plasma bombardment during the dry etching process at step S230, so that defects such as lattice mismatch occur at the edges for example. In an embodiment, the potentially damaged edges of the recess 305 (including the vertices C' and D') can be removed by the isotropic wet etching process at step S240, to expose the surfaces with no or fewer defects to overcome the problems in the prior art, where portions in the substrate that have lattice defects can cause difficulty in the epitaxial growth of a SiGe seed layer.

Figure 3E:
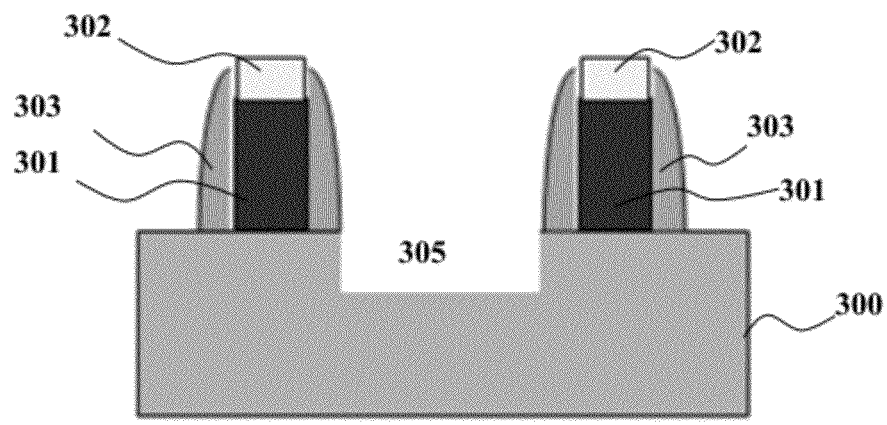

At step S250 in FIG. 2, the sacrificial spacers 304 are removed as shown in FIG. 3E. In one embodiment, the sacrificial spacers 304 can be removed by an isotropic wet etching or plasma striping process. For example, an HF solution can be used in the etching when the sacrificial spacers 304 are formed of $SiO_2$.

Figure 3F:
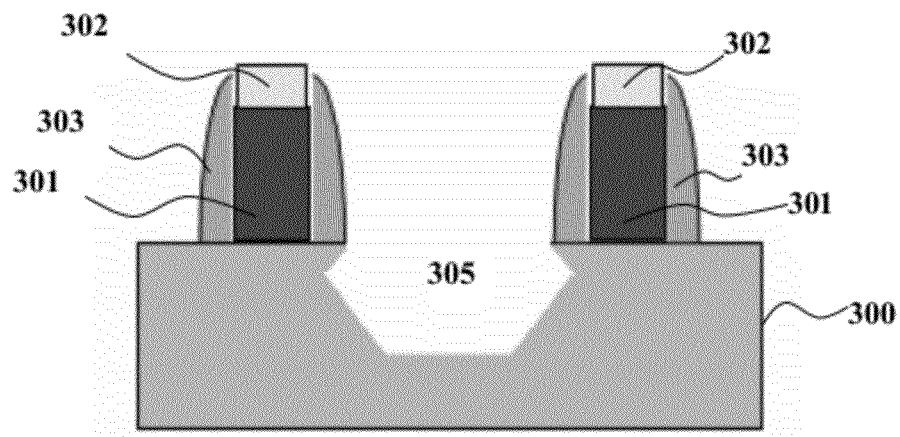

At step S260 in FIG. 2, orientation selective wet etching is performed on the recess 305 to shape the inner walls of the recess 305 into Σ form, as shown in FIG. 3F. In one embodiment, an orientation selective wet etching process that has an etch rate higher on the (100) orientation of planes than on the (111) orientation of planes can be used. For example, tetramethylammonium hydroxide (TMAH) with a mass concentration of 10% to 25% can be used for etching at a temperature of about 70° C. to about 90° C. in an embodiment. In such case, the etching substantially stops on (111) orientation of planes.

It should be noted that, although it is disclosed in an embodiment of the present invention that the sacrificial spacers 304 are removed after the recess 305 is expanded to the width W2 by an isotropic wet etching. In another embodiment, the step of removing the sacrificial spacers 304 can be performed before the recess 305 is isotropically wet etched to an expanded width, as indicated by a dotted line labeled "A" in FIG. 2. In yet another embodiment, the removal of the sacrificial spacers 304 can be performed after the recess 305 is orientation-selectively wet etched into a Σ shape, as indicated by a dotted line labeled "B" in FIG. 2. In other words, the step S250 in FIG. 2 can be performed before the step S240 or after the step S260.

It should be noted that, before forming the sacrificial spacers (i.e., before step S220 in FIG. 2) or after the orientation selective wet etching of the recess (i.e., after step S260 in FIG. 2), ion implantation can be performed on the substrate to form source and drain regions.

By removing portions of the substrate having lattice defects caused by dry etching and wet etching processes, the disclosed method can realize good epitaxial growth performance of SiGe.

It should be noted that, eSiGe structures functioning as source/drain regions generally work in PMOS transistors. Thereby, with respect to semiconductor devices having both PMOS and NMOS transistors, it is necessary to shield the portions of NMOS transistors with a mask or the like during the formation of Σ shaped recesses for the PMOS transistors.

Thus, a method of fabricating semiconductor device has been described in detail according to embodiments of the present invention. Some details that are well known in the art are not discussed for the purpose of not to obscure the concept of present invention. From the above description, those skilled in the art can thoroughly understand how to implement the technique solutions disclosed herein.

In another embodiment, a method includes forming a plurality of gate structures on a substrate, forming a mask layer on a top surface of each gate structure, forming sidewall spacers on opposite sides of each gate structure, forming sacrificial spacers on the sidewall spacers, and forming a rectangular-shape recess in the substrate using a dry etching technique, wherein the recess is formed between two adjacent gate structures using the mask layer and the sacrificial spacers as a mask, and the recess has a first width that is substantially equal to a distance between the sacrificial spacers. The method further includes etching the first width of the recess using an isotropic wet etching process to enlarge the first width to a second width, wherein the second width is substantially equal to a distance between the sidewall spacers on the two adjacent gate structures. The method also includes shaping the enlarged recess into a Σ-shaped recess using an orientation selective wet etching process.

In an embodiment, the method additionally includes removing the sacrificial spacers prior to forming the recess. In another embodiment, the method includes removing the sacrificial spacers after shaping the rectangular-shaped recess into a Σ-shaped recess.

Although some specific embodiments of this invention have been illustrated in detail by way of examples, those skilled in the art will appreciate that the above examples are merely illustrative and are not intended to limit the scope of this invention. It should be understood by a person skilled in the art that the above embodiments can be modified without departing from the scope and spirit of the present invention. The scope of the present invention is defined by the attached claims.

What is claimed is:

1. A method of fabricating a semiconductor device, the method comprising:
    forming a plurality of gates on a substrate;
    forming a top layer on a top surface of each gate;
    forming sidewall spacers on opposite sides of each gate;
    forming sacrificial spacers on the sidewall spacers;
    performing a dry etching process on the substrate using the top layer and the sacrificial spacers as a mask to form a recess of a first width in the substrate between two adjacent gates;
    performing an isotropic wet etching process on the recess to expand the first width to a second width; and
    performing an orientation selective wet etching process on the recess expanded to the second width to shape inner walls of the recess into a Σ-shaped recess.

2. The method of claim 1, wherein the step of forming sacrificial spacers comprises:
    depositing a sacrificial spacing material on the sidewall spacers and a surface of the substrate; and
    removing the sacrificial spacing material deposited on the surface of the substrate by a dry etching process.

3. The method of claim 2, wherein the depositing comprises an atom layer deposition (ALD).

4. The method of claim 1 further comprising removing the sacrificial spacers.

5. The method of claim 1, wherein the second width of the recess is substantially equal to a distance between outer edges of adjacent sidewall spacers.

6. The method of claim 1, wherein the sacrificial spacers comprises a material that is different from a material of the sidewall spacers.

7. The method of claim 1, wherein the sacrificial spacers comprise silicon nitride or silicon oxide.

8. The method of claim 1, wherein the step of removing the sacrificial spacers comprises removing the sacrificial spacers by an isotropic wet etching or plasma striping process.

9. The method of claim 1, wherein the step of performing isotropic wet etching process on the recess comprises performing a wet etching process on the recess with HF, HNO3 or ammonia.

10. The method of claim 1, wherein the step of performing an orientation selective wet etching process on the recess comprises performing a wet etching process on the recess with tetramethylammonium hydroxide (TMAH) with a mass concentration of 10% to 25% and at a temperature of about 70° C. to about 90° C.

11. The method of claim 1, wherein the orientation selective wet etching comprises an etching rate on a (100) orientation of planes that is faster than an etching rate on a (111) orientation of planes.

12. The method of claim 1, wherein the orientation selective wet etching substantially stops on a (111) orientation of planes.

13. The method of claim 1, wherein the plurality of gates formed on the substrate comprises polysilicon.

14. The method of claim 1 further comprising performing an epitaxial growth of SiGe in the Σ-shaped recess.

15. The method of claim 14 further comprising:
    performing an ion implantation on the substrate to form source and drain regions.

16. The method of claim 1 further comprising:
    performing an ion implantation on the substrate to form source and drain regions before forming the sacrificial spacers.

17. The method of claim 1, wherein the recess comprises a depth ranging from about 300Å to about 500 Å before performing the orientation selective wet etching process.

18. The method of claim 1 further comprising before performing the dry etching process on the substrate to form the recess of the first width, forming a mask on top of areas to be formed as NMOS devices and exposing areas to be formed as PMOS devices.

* * * * *